(12) United States Patent
Wang

(10) Patent No.: US 10,586,814 B2
(45) Date of Patent: Mar. 10, 2020

(54) DISPLAY PANEL

(71) Applicant: BOE TECHNOLOGY GROUP CO., LTD., Beijing (CN)

(72) Inventor: Zuqiang Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/078,319

(22) PCT Filed: Jan. 4, 2018

(86) PCT No.: PCT/CN2018/071376
§ 371 (c)(1),
(2) Date: Aug. 21, 2018

(87) PCT Pub. No.: WO2018/205659
PCT Pub. Date: Nov. 15, 2018

(65) Prior Publication Data
US 2019/0288014 A1  Sep. 19, 2019

(30) Foreign Application Priority Data

May 12, 2017 (CN) .......................... 2017 1 0332764

(51) Int. Cl.
*H01L 27/12* (2006.01)

(52) U.S. Cl.
CPC ...... *H01L 27/1244* (2013.01); *H01L 27/1259* (2013.01)

(58) Field of Classification Search
CPC .................. H01L 27/1244; H01L 27/1259
See application file for complete search history.

(56) References Cited

U.S. PATENT DOCUMENTS

| 9,746,731 B2 | 8/2017 | Jiang |
| 2007/0152922 A1* | 7/2007 | Jung ............... H01L 27/3276 345/76 |
| 2008/0117558 A1* | 5/2008 | Shih ................. G02F 1/136204 361/117 |
| 2011/0057187 A1* | 3/2011 | Sakakura ........... H01L 27/1225 257/43 |

FOREIGN PATENT DOCUMENTS

| CN | 101562162 A | 10/2009 |
| CN | 104064567 A | 9/2014 |
| CN | 106338866 A | 1/2017 |
| CN | 104375347 B | 6/2017 |
| TW | 200807732 A | 2/2008 |

OTHER PUBLICATIONS

International Search Report and Written Opinion dated Apr. 16, 2018 from State Intellectual Property Office of the P.R. China.

* cited by examiner

*Primary Examiner* — Sonya D. McCall-Shepard
(74) *Attorney, Agent, or Firm* — Dilworth & Barrese, LLP.; Michael J. Musella, Esq.

(57) ABSTRACT

A display panel includes: a base substrate; a peripheral circuit located on the base substrate, the peripheral circuit including a first circuit, a second circuit and a third circuit, and the first circuit, the second circuit and the third circuit respectively including a first electrode pattern, a second electrode pattern and a third electrode pattern; and a protection structure, located in at least one circuit of the first circuit, the second circuit and the third circuit and configured for preventing an electrode pattern from being disconnected.

17 Claims, 7 Drawing Sheets

US 10,586,814 B2

DISPLAY PANEL

CROSS-REFERENCE TO RELATED APPLICATIONS

The present application claims priority of Chinese Patent Application No. 201710332764.4 filed on May 12, 2017, the disclosure of which is incorporated herein by reference in its entirety.

TECHNICAL FIELD

Embodiments of the present disclosure relate to a display panel.

BACKGROUND

A fabrication procedure of a display device comprises a bonding process of bonding a circuit structure of a peripheral region of a display panel to an external circuit. However, while the above-described circuit structure of the peripheral region is bonded, an electrode pattern located on a surface of the circuit may be scratched, which further results in a problem such as electrode disconnection.

SUMMARY

Embodiments of the present disclosure provide a display panel, wherein, one objective is to prevent a peripheral circuit of the display panel from being scratched.

According to an embodiment of the present disclosure, it is provided a display panel, comprising: a base substrate; a peripheral circuit located on the base substrate, the peripheral circuit comprising a first circuit, a second circuit and a third circuit, and the first circuit, the second circuit and the third circuit respectively comprising a first electrode pattern, a second electrode pattern and a third electrode pattern; and a protection structure, located in at least one circuit of the first circuit, the second circuit and the third circuit and configured for preventing an electrode pattern located in the at least one circuit from being disconnected.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 2-1 is a top view of a display panel according to an embodiment of the present disclosure;

FIG. 2-2 is a cross-sectional view of a circuit 12A in FIG. 2-1;

FIG. 2-3 is a cross-sectional view of a circuit 12B in FIG. 2-1;

FIG. 3 is a cross-sectional view of a peripheral circuit of a display panel according to an embodiment of the present disclosure;

FIG. 4-1 is a cross-sectional view of a circuit 12A according to another embodiment of the present disclosure;

FIG. 4-2 is a cross-sectional view of a circuit 12A according to a further embodiment of the present disclosure;

FIG. 4-3 is a cross-sectional view of a circuit 12A according to still another embodiment of the present disclosure;

FIG. 5-1 is a cross-sectional view of a circuit 12C according to an embodiment of the present disclosure;

FIG. 5-2 is a cross-sectional view of a circuit 12C according to another embodiment of the present disclosure;

FIG. 5-3 is a cross-sectional view of a circuit 12C according to a further embodiment of the present disclosure;

FIG. 6-1 is a cross-sectional view of a circuit 12B according to another embodiment of the present disclosure;

FIG. 6-2 is a top view of a circuit 12B according to a further embodiment of the present disclosure;

FIG. 7-1 is a flow chart of a bonding method of a display panel provided by an embodiment of the present disclosure;

FIG. 7-2 is a flow chart of a bonding method of a display panel provided by another embodiment of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprises," "comprising," "comprises," "comprising," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may comprise an electrical connection, directly or indirectly. "On," "under," "right," "left" and the like are only used to indicate relative position relationship, and when the position of the object which is described is changed, the relative position relationship may be changed accordingly.

Figure 1:
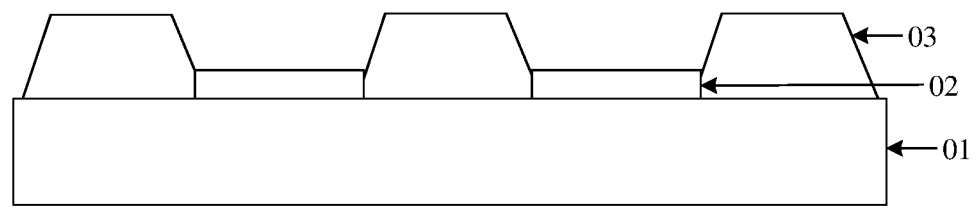
FIG. 1 is a cross-sectional view of a peripheral circuit of a display panel related to the present disclosure.

FIG. 1 is a structural schematic diagram of a display panel related to the present disclosure. As illustrated in FIG. 1, it is a structural schematic diagram of a flexible printed circuit (FPC), a contact electrode 02 is provided on a substrate structure 01, and a planarization layer 03 is formed on the substrate structure 01 on which the contact electrode 02 is formed. When the FPC is bonded to an external circuit board, an electrode in the external circuit board may be electrically connected with the contact electrode 02.

Figures 1, 2:
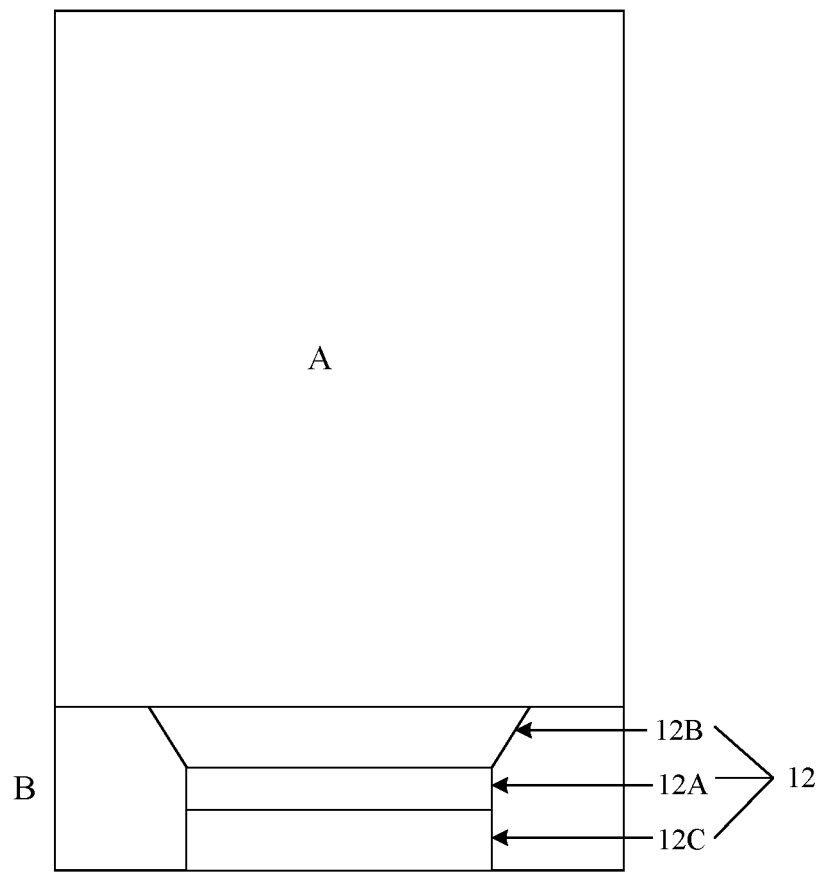
Figure 2:
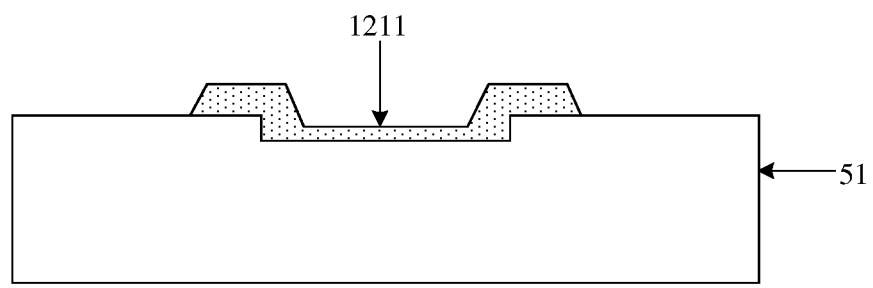

FIG. 2-1 is a structural schematic diagram of various circuits according to an embodiment of the present disclosure. A display panel 10 comprises: an active region A (i.e., a display region) and a peripheral region B, the peripheral region B is provided therein with a peripheral circuit 12, and the peripheral circuit 12 may comprise a Chip On Glass (COG) circuit 12A, a FanOut circuit 12B and an FPC 12C.

A structure of the FPC 12C may be as illustrated in FIG. 1. The COG circuit 12A is configured for bonding to an integrated circuit (IC), the FanOut circuit 12B is configured for connecting with the bonded IC, and the FPC 12C is configured for connecting with an external circuit board.

Figures 2, 3:
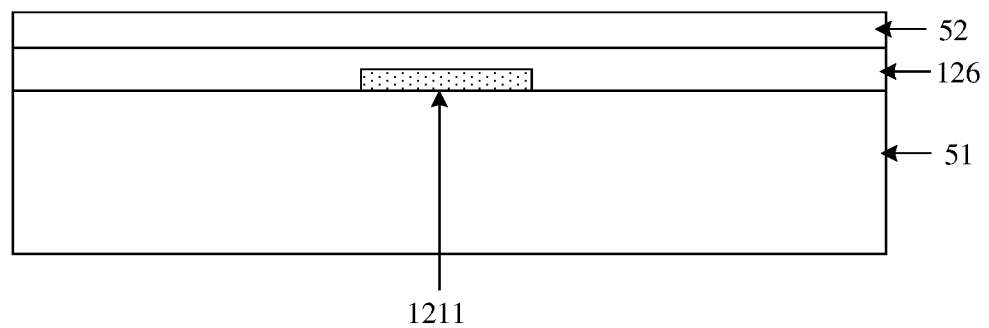
Figure 3:
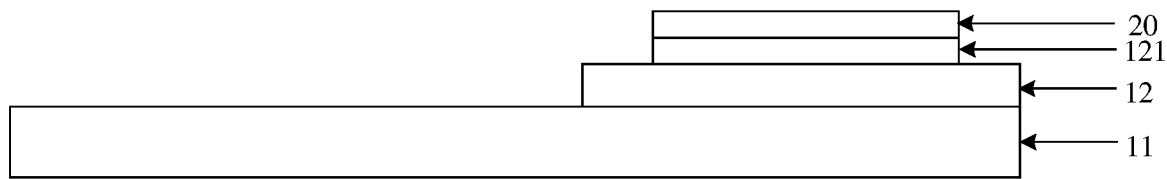

FIG. 2-2 is a structural schematic diagram of the COG circuit 12A according to the present disclosure. A source-drain contact electrode 1211 is formed on a substrate structure 51, and is easily scratched and disconnected. FIG. 2-3 is a structural schematic diagram of the FanOut circuit 12B according to the present disclosure. The source-drain contact electrode 1211 is formed on the substrate structure 51, and a planarization layer 126 and a Pixel definition layer (PDL) 52 are formed above the source-drain contact electrode 1211. The PDL 52 may be made of polyimide (PI), and the planarization layer 126 and the pixel definition layer 52 are both soft in material, so it is difficult to protect the source-drain contact electrode 1211 from being scratched.

An embodiment of the present disclosure provides a display panel, comprising: a base substrate; a peripheral circuit located on the base substrate; the peripheral circuit comprising a first circuit, a second circuit and a third circuit, the first circuit, the second circuit and the third circuit respectively comprising a first electrode pattern, a second electrode pattern and a third electrode pattern; and a protection structure, located in at least one circuit of the first circuit, the second circuit and the third circuit, the protection structure comprises at least one of the first electrode pattern, the second electrode pattern and the third electrode pattern, for preventing an electrode pattern located in the at least one circuit from being disconnected.

In at least some embodiments, the first circuit is a Chip On Glass circuit, the second circuit is a flexible printed circuit, and the third circuit is a FanOut circuit.

In at least some embodiments, the protection structure is located in at least two circuits of a Chip On Glass circuit, a flexible printed circuit and a FanOut circuit, or located in each of the above-described circuits.

In at least some embodiments, the first electrode pattern, the second electrode pattern and the third electrode pattern respectively comprise a plurality of source-drain contact electrodes.

In the display panel provided by the embodiments of the present disclosure, by providing the protection structure, the source-drain contact electrode pattern is prevented from being scratched and disconnected, which solves the problem in the related art that the source-drain contact electrode pattern may be scratched and even disconnected while the circuit structure of the peripheral region is bonded, and achieves an effect that the source-drain contact electrode pattern is not easily scratched.

For example, FIG. 3 is a cross-sectional view of a peripheral circuit of a display panel according to an embodiment of the present disclosure. The display panel 10 may comprise: a base substrate 11; a peripheral circuit 12 is provided on the base substrate 11, and a source-drain contact electrode pattern 121 is provided in the peripheral circuit 12. A protective layer 20 is provided on the base substrate 11 which is provided with the peripheral circuit 12, and the protective layer 20 is configured for preventing the source-drain contact electrode pattern 121 from being disconnected.

Hereinafter, the protection structure in each of three circuits comprising a Chip On Glass circuit, a flexible printed circuit and a FanOut circuit will be described in the embodiments of the present disclosure.

For convenience of description, FIG. 4-1, FIG. 4-2 and FIG. 4-3 only illustrate a Chip On Glass circuit 12A in the peripheral circuit of the display panel, and a structure of the display region of the display panel will not be discussed here.

Figures 1, 4:
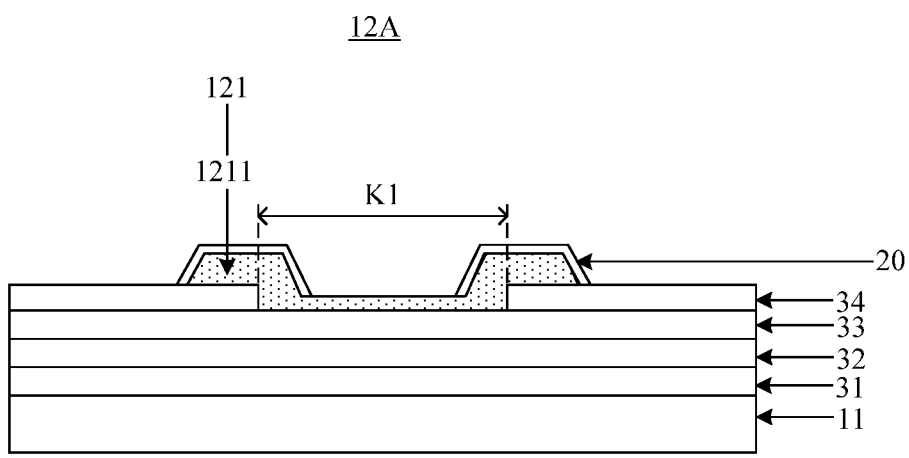
Figures 2, 4:
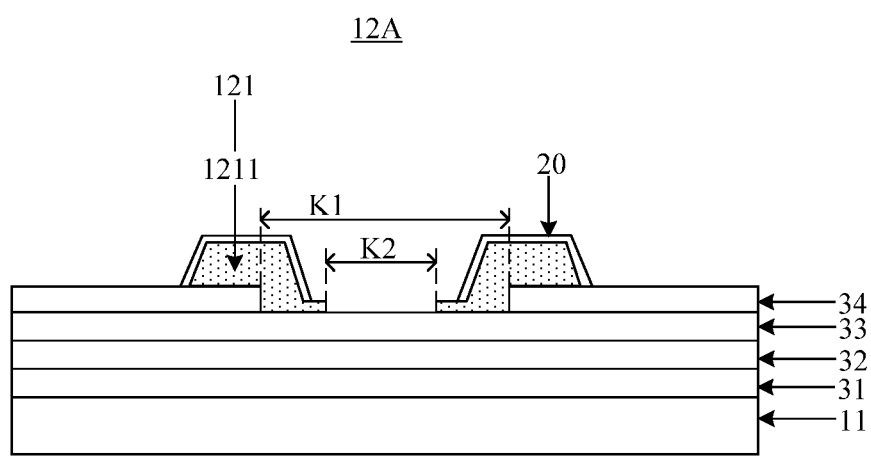
Figures 3, 4:
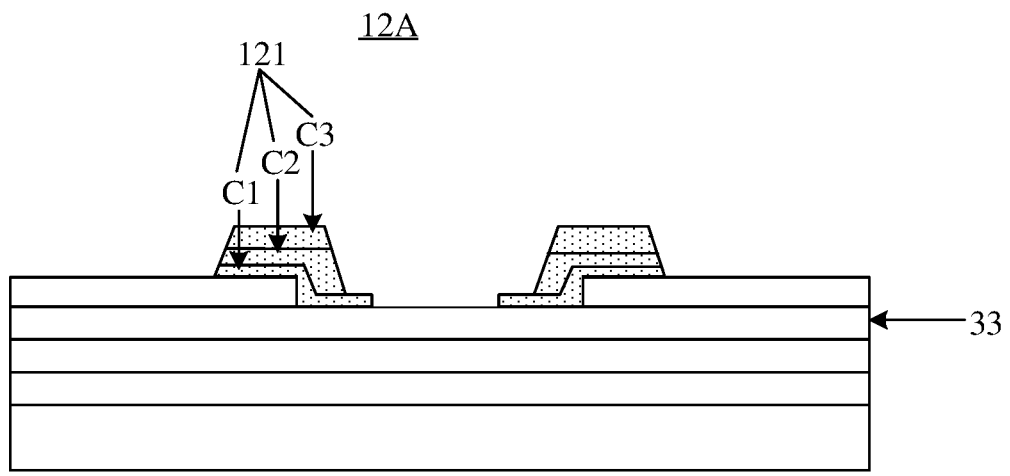

With reference to FIG. 4-1, in at least some embodiments, a peripheral circuit comprises a Chip On Glass circuit 12A, and a protection structure in the Chip On Glass circuit 12A comprises a dielectric layer 34, an electrode pattern and a protective layer 20 sequentially provided on a base substrate 11. The dielectric layer 34 comprises at least one first via hole K1, and at least a portion of the electrode pattern is in contact with and overlays a peripheral edge of the at least one first via hole K1. The protective layer 20 is in contact with and overlays the at least one portion of the electrode pattern.

In at least some embodiments, an electrode pattern comprises a source-drain contact electrode pattern 121, and the source-drain contact electrode pattern 121 comprises a plurality of source-drain contact electrodes 1211. FIG. 4-1 shows one of the source-drain contact electrodes 1211, and the source-drain contact electrode pattern 121 may further comprise more than one source-drain contact electrode 1211, which will not be specifically illustrated in the embodiments of the present disclosure.

As illustrated in FIG. 4-1, at least a portion of the source-drain contact electrode pattern 121 is in contact with and overlays the peripheral edge of the at least one first via hole K1; in other words, the source-drain contact electrode pattern 121 surrounds the periphery of the first via hole K1. The first protective layer 20 overlays a peripheral edge of each of the plurality of source-drain contact electrodes 1211. The protective layer 20 may be simultaneously formed with a pixel electrode of the display panel by a single patterning process, without increasing the number of patterning processes. Here, "single patterning process" refers to patterning performed with a same mask, and the "patterning process" refers to, for example, coating a layer of photoresist, exposing and developing with a mask, then etching, and other processes. The protective layer 20 is made of a transparent conductive material, which may comprise, for example, Indium tin oxide (ITO). ITO has higher hardness, and is capable of effectively protecting the source-drain contact electrode.

The base substrate 11 may be further provided thereon with a buffer layer 31, a gate insulating layer 32 is provided on the base substrate 11 having the buffer layer 31 formed thereon, a gate electrode 33 is provided on the base substrate 11 having the gate insulating layer 32 formed thereon, a dielectric layer 34 is provided on the base substrate 11 having the gate electrode 33 formed thereon, the first via holes K1 in one to one correspondence with the plurality of source-drain contact electrodes 1211 may be provided on the dielectric layer 34, and each source-drain contact electrode 1211 may be in contact with the gate electrode 33 through one of the first via holes K1 therein. At least a portion of the source-drain contact electrode 1211 overlays an inner wall of the first via hole K1, and the protective layer 20 further extends into the first via hole K1. That is to say, the protective layer 20 is in contact with and overlays all surfaces of the source-drain contact electrode 1211 which protrudes from a surface of the dielectric layer 34.

The Chip On Glass circuit 12A illustrated in FIG. 4-1 protects the source-drain contact electrode 1211 through the protective layer 20 which overlays the peripheral edge of the electrode pattern, so that the source-drain contact electrode 1211 is not easily scratched, which reduces possibility of disconnection. At the same time, the source-drain contact electrode 1211 has other regions exposed, in addition to edges overlaid by the protection structure, as a result, while the source-drain contact electrode is bonded, a resistance will not be too large, which reduces impact caused by an IR Drop phenomenon.

As illustrated in FIG. 4-2, a Chip On Glass circuit 12A according to another embodiment of the present disclosure comprises a source-drain contact electrode pattern 121, a dielectric layer 34 and a gate electrode 33. The dielectric layer 34 comprises a plurality of first via holes K1, and the source-drain contact electrode pattern 121 comprises a plurality of source-drain contact electrodes 1211. The dielectric layer 34 may be an inter-layer Dielectric (ILD). Other reference numerals in FIG. 4-2 may be referred to those in FIG. 4-1, which will not be repeated here.

The gate electrode 33 is provided on a base substrate 11. The dielectric layer 34 is provided on the base substrate 11 having the gate electrode 33 formed thereon. The source-drain contact electrode pattern 121 is provided on the base substrate 11 having the dielectric layer 34 formed thereon, and is in contact with the gate electrode 33 through the plurality of first via holes K1; and the plurality of source-drain contact electrodes 1211 corresponds to the plurality of first via holes K1 one by one.

The source-drain contact electrode 1211 comprises a plurality of second via holes K2, the second via hole K2 is, for example, located at the bottom of the first via hole K1, the gate electrode 33 is exposed at the second via hole K2, and the source-drain contact electrode 1211 is in contact with the gate electrode 33 through the first via hole K1. In this way, the gate electrode 33 may be taken as a contact electrode during bonding, and the source-drain contact electrode 1211 may be configured for protecting the gate electrode 33, to prevent the gate electrode 33 from being scratched.

In at least some embodiments, a protection structure in FIG. 4-2 further comprises a protective layer 20, which overlays an edge of each of a plurality of source-drain contact electrodes 1211. The protective layer 20 may be simultaneously formed with a pixel electrode by using same patterning process, and is made of ITO. The protective layer 20 may further enhance a scratch-resistant ability of the source-drain contact electrode 1211.

As illustrated in FIG. 4-3, in at least some embodiments, a source-drain contact electrode pattern 121 is a laminated structure, the laminated structure comprises a first metal layer C1 in contact with a gate electrode 33, a second metal layer C2 in contact with the first metal layer C1, and a third metal layer C3 in contact with the second metal layer C2, and a thickness of the third metal layer C3 is greater than a thickness of the first metal layer C1. In the related art, the thickness of the third metal layer C3 is generally equal to the thickness of the first metal layer C1; and in the embodiment of the present disclosure, the thickness of the top third metal layer C3 is increased, so as to increase a scratch-resistant ability of the source-drain contact electrode pattern 121.

In at least some embodiments, the first metal layer C1 and the third metal layer C3 are titanium metal layers, and the titanium metal layer has a relatively strong scratch-resistant ability; the metal layer is an aluminum metal layer, and the aluminum metal layer has a relatively high electrical conductivity.

For convenience of description, FIG. 5-1, FIG. 5-2 and FIG. 5-3 only illustrate the flexible printed circuit 12C in the peripheral circuit of the display panel, and a structure of the display region of the display panel will not be discussed here.

For convenience of description, FIG. 4-1, FIG. 4-2 and FIG. 4-3 only illustrate the Chip On Glass circuit 12A in the peripheral circuit of the display panel, and the related art may be referred to for other structures of the display panel, which will not be repeated here.

In the display panel provided by the above-described embodiments of the present disclosure, by providing the protection structure, the source-drain contact electrode pattern is prevented from being scratched, which solves the problem in the related art that the source-drain contact electrode pattern may be scratched and even disconnected, when the circuit structure of the peripheral region is bonded, and achieves an effect that the source-drain contact electrode pattern is not easily scratched.

Figures 1, 5:
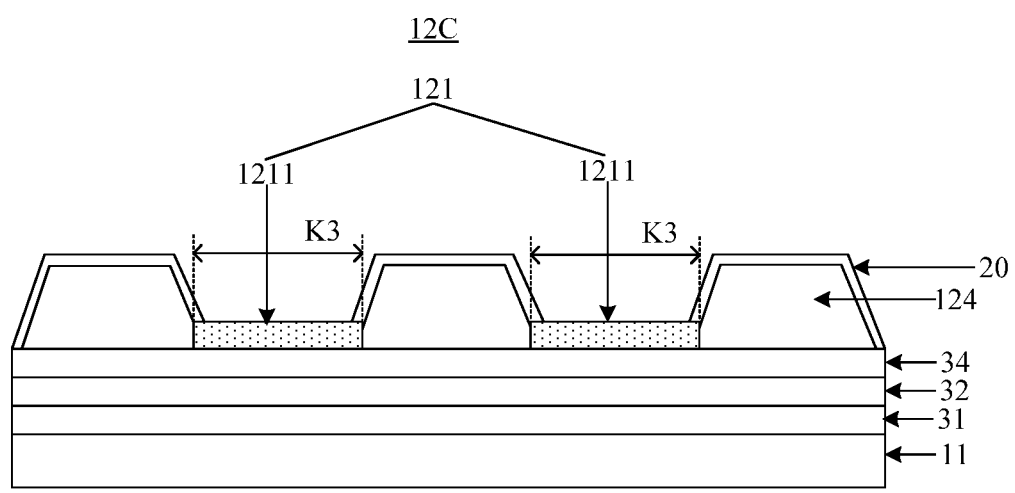
Figures 2, 5:
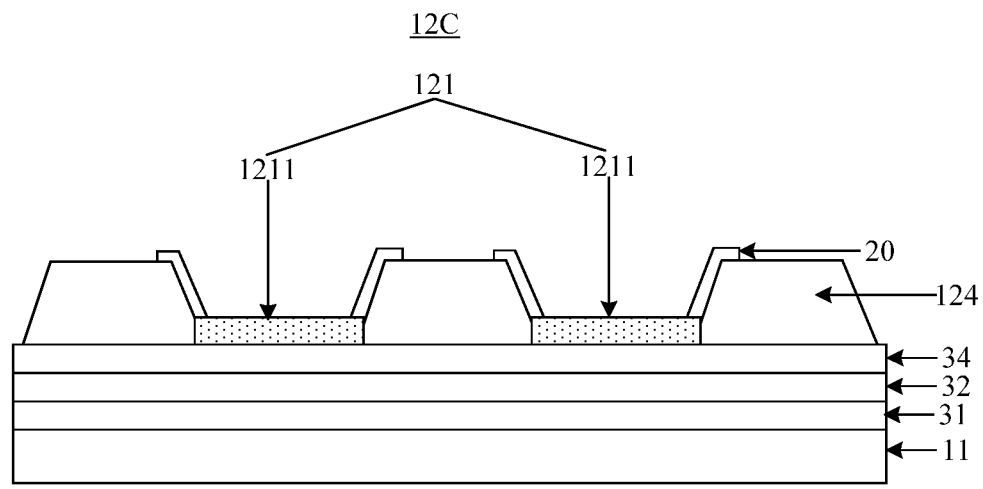
Figures 3, 5:
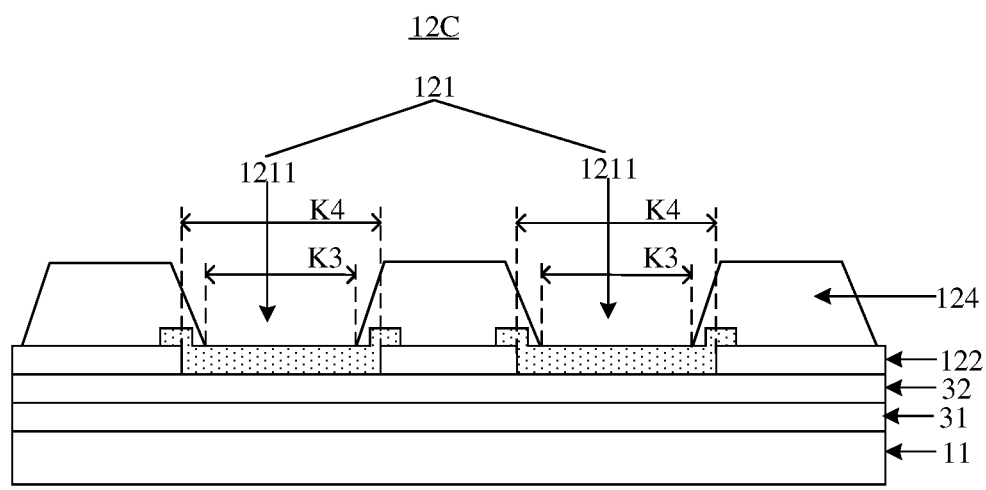

As illustrated in FIG. 5-1, the peripheral circuit comprises a flexible printed circuit 12C, the protection structure in the flexible printed circuit 12C comprises a source-drain contact electrode pattern 121, a planarization layer 124 and a protective layer 20; and a thickness of the planarization layer 124 is greater than a thickness of the source-drain contact electrode pattern 121.

In at least some embodiments, a base substrate 11 is provided thereon with a source-drain contact electrode pattern 121, and the source-drain contact electrode pattern 121 comprises a plurality of source-drain contact electrodes 1211. A planarization layer 124 is provided on the base substrate 11 having the source-drain contact electrode pattern 121 formed thereon, the planarization layer 124 comprises a plurality of third via holes K3, and the plurality of third via holes K3 correspond to the plurality of source-drain contact electrodes 1211 one by one. The source-drain contact electrode 1211 is provided in the third via hole K3.

A protective layer 20 overlays the planarization layer 124 and extends to the bottom of the third via hole K3, so as to be in contact with the source-drain contact electrode 1211. Since the planarization layer 124 is generally soft and easy to be scratched, the planarization layer 124 may be covered with the protective layer 20, to enhance a scratch-resistant ability of the planarization layer 124; under protection of the planarization layer 124, the source-drain contact electrode pattern 121 is also not easily scratched. The protective layer 20 overlays an entire outer surface of the planarization layer 124 and acts as an outermost layer. For a material of the protective layer 20, the foregoing embodiments may be referred to.

A buffer layer 31 may be further provided on the base substrate 11, a gate insulating layer 32 is provided on the base substrate 11 having the buffer layer 31 formed thereon, and a dielectric layer 34 is provided on the base substrate 11 having the gate insulating layer 32 formed thereon.

As illustrated in FIG. 5-2, in at least some embodiments, a protective layer 20 may also be provided only on a side surface of a planarization layer 124, and the side surface is adjacent to a third via hole K3, which may also achieve an effect of enhancing a scratch-resistant ability of the planarization layer 124. Other reference numerals in FIG. 5-2 may be referred to those in FIG. 5-1, which will not be repeated here.

As illustrated in FIG. 5-3, in at least some embodiments, a protection structure of a flexible printed circuit 12C comprises a source-drain contact electrode pattern 121 and an interlayer insulating layer 122; and the interlayer insulating layer 122 is provided with a plurality of fourth via holes K4. The interlayer insulating layer 122 may be an inter-layer dielectric.

A source-drain contact electrode pattern 121 is provided on a base substrate 11 having the interlayer insulating layer 122 formed thereon, the source-drain contact electrode pattern 121 comprises a plurality of source-drain contact electrodes 1211, the plurality of source-drain contact electrodes 1211 are provided in the plurality of fourth via holes K4, and the plurality of source-drain contact electrodes 1211 correspond to the plurality of fourth via holes K4 one by one.

A planarization layer 124 is provided on the base substrate 11 having the source-drain contact electrode pattern 121 formed thereon, the planarization layer 124 comprises a plurality of third via holes K3, and the plurality of third via holes K3 correspond to the plurality of source-drain contact electrodes 1211 one by one, so that each source-drain contact electrode 1211 may be exposed from the third via hole K3. The source-drain contact electrode pattern 121 is in contact with and overlays a peripheral edge of the fourth via hole, and the source-drain contact electrode pattern 121 extends into a contact region between the planarization layer 124 and the interlayer insulating layer 122.

As illustrated in FIG. 5-3, because the source-drain contact electrode pattern 121 is buried in the interlayer insulating layer 122, the source-drain contact electrode pattern 121 is not easily scratched.

In addition, a protective layer 20 as illustrated in FIG. 5-1 may also be formed on the planarization layer 124 in FIG. 5-3, to further protect the source-drain contact electrode pattern 121.

Other reference numerals in FIG. 5-3 may be referred to those in FIG. 5-1, which will not be repeated here.

In the display panel provided by the above-described embodiments of the present disclosure, by providing the protection structure, the source-drain contact electrode pattern is prevented from being scratched, which solves the problem in the related art that the source-drain contact electrode pattern may be scratched and even disconnected, when the circuit structure of the peripheral region is bonded, and achieves an effect that the source-drain contact electrode pattern is not easily scratched.

Figures 1, 6:
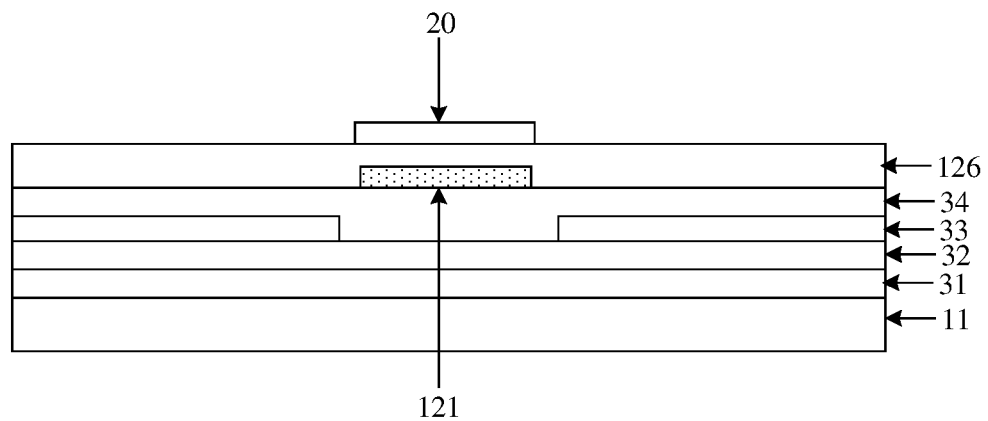
Figures 2, 6:
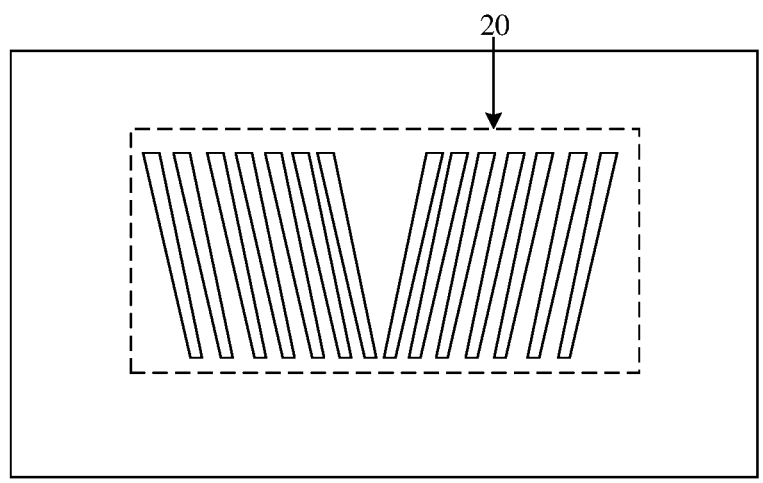

For convenience of description, FIG. 6-1 and FIG. 6-2 only show the FanOut circuit 12B in the peripheral circuit of the display panel, and a structure of the display region of the display panel will not be discussed here.

In at least some embodiments, a peripheral circuit comprises a FanOut circuit 12B, and a protection structure in the FanOut circuit 12B comprises a source-drain contact electrode pattern 121, a planarization layer 126 and a protective layer 20.

For example, a source-drain contact electrode pattern 121 is provided on a base substrate 11, and a planarization layer 126 is provided on the base substrate 11 having the source-drain contact electrode pattern 121 formed thereon. A protective layer 20 is provided on the base substrate 11 having the planarization layer 126 formed thereon, an orthographical projection of the source-drain contact electrode pattern 121 on the base substrate 11 overlaps with an orthographical projection of the protective layer 20 on the base substrate 11, that is, the protective layer 20 overlays right above the source-drain contact electrode pattern 121 to protect the source-drain contact electrode pattern 121.

In addition, a pixel definition layer may also be formed on the base substrate having the protective layer 20 formed thereon, which will not be limited in the embodiment of the present disclosure.

In at least some embodiments, as illustrated in FIG. 6-2, it is a top view of a FanOut circuit 12B in the display panel illustrated in FIG. 6-1. A protective layer 20 is composed of a plurality of blocky structures arranged at intervals. A source-drain contact electrode may exist below each blocky structure in FIG. 6-2. The spaced blocky structures may reduce material costs, and will not cause a problem such as disconnection, when the protective layer 20 is made of an electrically conductive material.

In at least some embodiments, a display panel comprises a pixel electrode pattern in a display region, and a protective layer 20 is provided in a same layer as the pixel electrode pattern. In this way, a protection structure may be provided without increasing the number of patterning processes.

In at least some embodiments, a protective layer 20 is made of, for example, indium tin oxide. Indium tin oxide is a harder material and may play a role in scratch resistance.

In the display panel provided by the above-described embodiments of the present disclosure, by providing the protection structure, the source-drain contact electrode pattern is prevented from being scratched and disconnected, which solves the problem in the related art that the source-drain contact electrode pattern may be scratched and even disconnected, when the circuit structure of the peripheral region is bonded, and achieves an effect that the source-drain contact electrode pattern is not easily scratched.

Figures 1, 7:
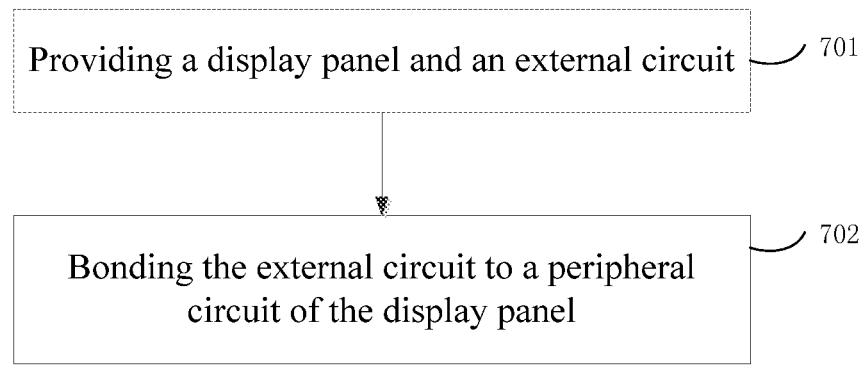
Figures 2, 7:
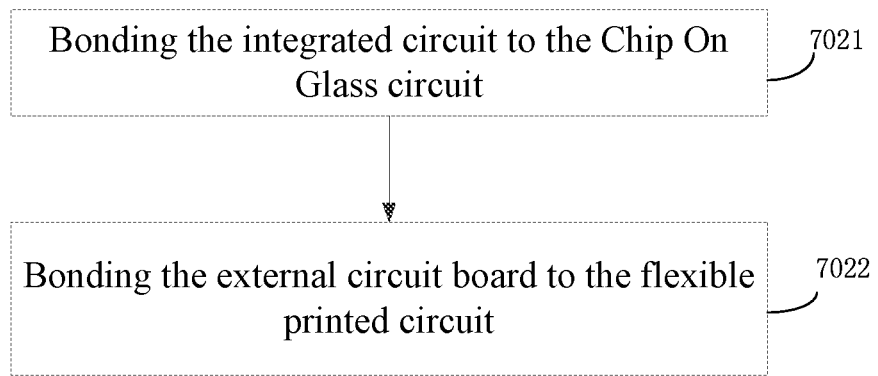

As illustrated in FIG. 7-1, it is a flow chart of a bonding method of a display panel provided by an embodiment of the present disclosure, which may be applied to the display panel illustrated in the above-described respective embodiments, and the bonding method of the display panel comprises:

Step 701: providing a display panel and an external circuit.

The external circuit comprises an integrated circuit and an external circuit board.

Step 702: bonding the external circuit to a peripheral circuit of the display panel.

The peripheral circuit may comprise a Chip On Glass circuit and a flexible printed circuit.

In the embodiment of the present disclosure, the Chip On Glass circuit and the flexible printed circuit may be separately bonded.

As illustrated in FIG. 7-2, the step may comprise two sub-steps below:

Sub-step 7021: bonding the integrated circuit to the Chip On Glass circuit.

The bonding may be performed with an anisotropic conductive adhesive film.

Sub-step 7022: bonding the external circuit board to the flexible printed circuit.

The bonding may be performed with an anisotropic conductive adhesive film.

In the bonding method of the display panel provided by the above-described embodiment of the present disclosure, by providing the protection structure, the source-drain contact electrode pattern during bonding is prevented from being scratched and disconnected, which solves the problem in the related art that the source-drain contact electrode pattern may be scratched and even disconnected, when the circuit structure of the peripheral region is bonded, and achieves an effect that the source-drain contact electrode pattern is not easily scratched.

In this disclosure, several points below need to be explained:

(1) The drawings of the embodiments of the present disclosure relate only to the structures involved in the embodiments of the present disclosure, and normal designs may be referred to for other structures.

(2) For the sake of clarity, in the drawings configured for describing the embodiments of the present disclosure, thicknesses of layers or regions are enlarged or reduced, that is, these drawings are not drawn in an actual scale.

(3) In case of no conflict, the embodiments of the present disclosure and the features in the embodiments may be combined with each other to obtain a new embodiment.

What is described above is related to the illustrative embodiments of the disclosure only and not limitative to the scope of the disclosure; the scopes of the disclosure are defined by the accompanying claims.

The invention claimed is:

1. A display panel, comprising:
a base substrate;
a peripheral circuit located on the base substrate, the peripheral circuit comprising a first circuit, a second circuit and a third circuit, and the first circuit, the second circuit and the third circuit respectively comprising a first electrode pattern, a second electrode pattern and a third electrode pattern; and
a protection structure, located in at least one circuit of the first circuit, the second circuit and the third circuit and configured for preventing an electrode pattern located in the at least one circuit from being disconnected,
wherein the protection structure comprises a first protection structure located in t first circuit, the first protection structure comprises a gate electrode, a dielectric layer and the first electrode pattern sequentially provided on the base substrate; the dielectric layer comprises at least one first via hole, at least a portion of the first electrode pattern is in contact with and overlays an edge of the at least one first via hole; the first electrode pattern comprises a second via hole located at a bottom of the first via hole, the first electrode pattern is in contact with the gate electrode through the at least one first via hole, and the gate electrode is exposed at the second via hole.

2. The display panel according to claim 1, wherein at least a portion of the first electrode pattern overlays an inner wall of the at least one first via hole.

3. The display panel according to claim 1, wherein the first electrode pattern comprises a laminated structure, the laminated structure comprises a first metal layer in contact with the gate electrode, a second metal layer in contact with the first metal layer, and a third metal layer in contact with the second metal layer, and a thickness of the third metal layer is greater than a thickness of the first metal layer.

4. The display panel according to claim 3, wherein the first metal layer and the third metal layer are titanium layers; and the second metal layer is an aluminum layer.

5. The display panel according to claim 1, wherein the protection structure further comprises a first protective layer overlying the first electrode pattern.

6. The display panel according to claim 1, wherein the first circuit is a Chip On Glass circuit, the second circuit is a flexible printed circuit, and the third circuit is a FanOut circuit.

7. The display panel according to claim 1, wherein the first protective layer is made of a transparent conductive material.

8. The display panel according to claim 7, wherein the transparent conductive material comprises indium tin oxide.

9. The display panel according to claim 1, further comprising a pixel electrode pattern, wherein the first protective layer is arranged in a same layer as the pixel electrode pattern.

10. The display panel according to claim 1, wherein the protection structure is located in each of the first circuit, the second circuit and the third circuit,
wherein the protection structure further comprises a second protection structure located in the second circuit, the second protection structure comprises the second electrode pattern, a planarization layer, and a second protective layer provided on the base substrate; the planarization layer comprises at least one third via hole, the second electrode pattern is provided in the at least one third via hole, the second protective layer overlays the planarization layer, and a thickness of the planarization layer is greater than a thickness of the second electrode pattern, and
wherein the protection structure further comprises a third protection structure located in the third circuit, the third protection structure comprises the third electrode pattern, a planarization layer, and a third protective layer sequentially provided on the base substrate, the third electrode pattern and the third protective layer are respectively located on opposite sides of the planarization layer, and an orthographical projection of the third electrode pattern on the base substrate overlaps with an orthographical projection of the third protective layer on the base substrate.

11. A display panel, comprising:
a base substrate;
a peripheral circuit located on the base substrate, the peripheral circuit comprising a first circuit, a second circuit and a third circuit, and the first circuit, the second circuit and the third circuit respectively comprising a first electrode pattern, a second electrode pattern and a third electrode pattern; and
a protection structure, located in at least one circuit of the first circuit, the second circuit and the third circuit and configured for preventing an electrode pattern located in the at least one circuit from being disconnected,
wherein the protection structure comprises a second protection structure located in the second circuit, the second protection structure comprises the second electrode pattern, a planarization layer, and a second protective layer provided on the base substrate; the planarization layer comprises at least one third via hole, the second electrode pattern is provided in the at least one third via hole, the second protective layer overlays the planarization layer, and a thickness of the planarization layer is greater than a thickness of the second electrode pattern.

12. The display panel according to claim 11, wherein the second protective layer extends to a bottom of the at least one third via hole to be in contact with the second electrode pattern.

13. The display panel according to claim 11, wherein the second protective layer overlays an entire outer surface of the planarization layer.

14. The display panel according to claim 11, wherein the second protection structure further comprises an interlayer insulating layer, the interlayer insulating layer comprises at least one fourth via hole, the second electrode pattern is located in the at least one fourth via hole, the second electrode pattern is in contact with and overlays an edge of the at least one four via hole, and the second electrode pattern extends into a contact region between the planarization layer and the interlayer insulating layer.

15. The display panel according to claim 11, wherein the second protective layer is made of a transparent conductive material.

16. A display panel, comprising:
a base substrate;

a peripheral circuit located on the base substrate, the peripheral circuit comprising a first circuit, a second circuit and a third circuit, and the first circuit, the second circuit and the third circuit respectively comprising a first electrode pattern, a second electrode pattern and a third electrode pattern; and a protection structure, located in at least one circuit of the first circuit, the second circuit and the third circuit and configured for preventing an electrode pattern located in the at least one circuit from being disconnected, wherein the protection structure comprises a third protection structure located in the third circuit, the third protection structure comprises the third electrode pattern, a planarization layer, and a third protective layer sequentially provided on the base substrate, the third electrode pattern and the third protective layer are respectively located on opposite sides of the planarization layer, and an orthographical projection of the third electrode pattern on the base substrate overlaps with an orthographical projection of the third protective layer on the base substrate.

17. The display panel according to claim 16, wherein the third protective layer is made of a transparent conductive material.

* * * * *